United States Patent [19]

Terayama

[11] Patent Number: 5,736,849
[45] Date of Patent: Apr. 7, 1998

[54] SEMICONDUCTOR DEVICE AND TEST METHOD FOR CONNECTION BETWEEN SEMICONDUCTOR DEVICES

[75] Inventor: Fumihiko Terayama, Itami, Japan

[73] Assignee: Mitsubishi Denki Kabushiki Kaisha, Tokyo, Japan

[21] Appl. No.: 519,334

[22] Filed: Aug. 25, 1995

[30] Foreign Application Priority Data

Aug. 25, 1994 [JP] Japan .................... 6-201136

[51] Int. Cl.$^6$ .................... G01R 31/28
[52] U.S. Cl. .................... 324/158.1; 324/765; 371/22.3
[58] Field of Search .................... 324/763, 765, 324/158.1; 365/201; 371/22.1, 21.1, 22.5, 22.3

[56] References Cited

U.S. PATENT DOCUMENTS

| 5,079,744 | 1/1992 | Tobita et al. | 365/201 |
|---|---|---|---|
| 5,140,554 | 8/1992 | Schreck et al. | 365/201 |
| 5,254,940 | 10/1993 | Oke et al. | 324/763 |

FOREIGN PATENT DOCUMENTS

| 2-25775 | 1/1990 | Japan . |
|---|---|---|
| 2-26412 | 1/1990 | Japan . |
| 5-55889 | 3/1993 | Japan . |
| 5-75427 | 3/1993 | Japan . |

Primary Examiner—Ernest F. Karlsen
Attorney, Agent, or Firm—Lowe, Price, LeBlanc & Becker

[57] ABSTRACT

The invention provides a semiconductor device capable of switching drive powers of an output buffer thereof smaller than that for an ordinary operation for detecting even a slight short caused when a component is lying on a wiring pattern, thereby preventing damage of the device in the test even when the wiring pattern between the devices are short-circuited, and further provides a semiconductor device capable of switching drive powers of an output buffer thereof larger than that for an ordinary operation for surely detecting a short between a connection series including the above-mentioned semiconductor device and another connection series including a semiconductor device only having drive powers for the ordinary operation. The invention also provides a method for testing a connection between semiconductor devices capable of surely detecting a short between at least two connection series even on a board where a connection series is included with a conventional semiconductor device only having a drive power for the ordinary operation being mixed, by means of disposing a semiconductor device capable of switching drive powers of an output buffer in at least two levels in another connection series in the upper stream of the current flow, and switching the drive powers of the device to be larger or smaller.

5 Claims, 10 Drawing Sheets

SEMICONDUCTOR DEVICE AND TEST METHOD FOR CONNECTION BETWEEN SEMICONDUCTOR DEVICES

BACKGROUND OF THE INVENTION

1. Field of the Invention

The present invention relates to a semiconductor device that outputs data to another device via a buffer therein, and a method for testing connection between the semiconductor devices.

2. Description of the Related Art

An electronic apparatus produced by mounting a plurality of LSIs on a board is required to be tested after the mounting to ensure that the LSIs are correctly connected to one another. In one of the test methods for LSIs, a testing jig such as an LSI tester, a probe or the like is connected to an LSI to observe a voltage level, etc. of an output from the LSI. As the LSI that employs thus testing method, an LSI having an improved output buffer for outputting a test signal is proposed so as to, for example, increase the transfer speed of the test signal and decrease noise during the test (Japanese Patent Applications Laid-Open Nos. 2-26412 (1990), 5-55889 (1993), 5-75427 (1993) and 2-25775 (1990)).

A boundary scan method is an example of easily testable methods for LSIs mounted on a board. This boundary scan method is realized by extending a scan method, that is, an easily testable method for the internal of an LSI to an entire board. The specification of the boundary scan method is standardized as the IEED Std. 1149.1.

An expensive in-circuit tester such as the LSI tester is unnecessary for a board mounting LSIs testable by the boundary scan method because the LSIs can be accessed from the edge connector of the board. Therefore, an LSI such as a surface mounted component on which a test probe is difficult to set can be easily tested.

FIG. 1 is a block diagram showing the configuration of a conventional LSI 300 manufactured in accordance with the standard for the boundary scan method. In the LSI 300, signals received through input pins IP1, IP2 and IP3 are supplied to an internal logic 102 via respective input buffers 101, and the internal logic 102 performs a logical operation on the received signals. The LSI 300 further includes output buffers 10T and output pins OP1, OP2 and OP3. Each of the output buffers 107 has an enable terminal 8, that is, an input terminal for an enable signal that controls whether an output driver (described in detail below) is enabled to output data, and an output data terminal 7, that is, an input terminal for the data output by the output driver. When the enable signal becomes significant, the output buffer 107 outputs the data received through the output data terminal 7 from the corresponding output pin OP1, OP2 or OP3 connected to a pad 8 provided to each output buffer 107.

Further, the LSI 300 has, as terminals for test use only, an input pin TMS for a test mode selecting signal that is set when testing the board, a test data input pin TDI, a test clock input pin TCK and a test data output pin TDO. The LSI 300 further includes a boundary scan logic 103; and boundary register cells 104 as a circuit for the test. The boundary scan logic 103 includes an instruction register 103a for loading a test instruction such as an EXTEST instruction for testing connection between the LSIs by outputting a test signal from one LSI to the other, and an instruction decoder 103b for decoding the instruction loaded in the instruction register 103a. The boundary register cells 104 are provided between the respective input buffers 101 and the internal logic 102 and between the internal logic 102 and the respective output buffers 107 corresponding to the respective input pins IP1, IP2 and IP3, the respective enable terminals (ENABLE) 6, and the respective output data terminals (OUTPUT) 7.

The boundary register cells 104 are connected in series to the boundary scan logic 103 so as to form a shift register. When testing connection to another LSI, the boundary scan logic 103 sets test data in the boundary register cells 104, the test data set in each boundary register cell 104 is shifted synchronously with the test clock in a direction indicated by an arrow in the figure. The boundary scan logic 103 outputs values output by the boundary register cells 104 corresponding to the output data terminal 7 via the output buffers 107 to the outside. Further, the boundary scan logic 103 latches the test data input in the input buffer 101 from the other LSI via the input pins IP1IP3 into the boundary register cells 104 on the side of the input buffer 101, and outputs the latching data to the outside via the test data output pin TDO so as to make the values observable.

In the ordinary operation of the LSI 300, an input signal is input to the LSI 300 through the input pins IP1, IP2 and IP3, transferred to the input buffers 101 and the boundary register cells 104 disposed between the input buffers 101 and the internal logic 102, and reaches the internal logic 102. An output signal from the internal logic 102 is transferred to the boundary register cells 104 disposed between the internal logic 102 and the output buffers 107 to reach the output buffers 107, and is output from the output pins OP1, OP2 and OP3.

FIG. 2 is a circuit diagram showing an exemplified configuration of the output buffer 107 in the LSI shown in FIG. 1.

The output buffer 107 shown in FIG- 2 has an output driver 107a formed by CMOS transistors, namely, a P-channel transistor 1 whose source is connected to a power supply and an N-channel transistor 2 whose source is grounded. The gate of the P-channel transistor 1 is connected to the output terminal of a two-input NAND gate 3 receiving an enable signal from the enable terminal 6 and a signal from the output data terminal 7. The gate of the N-channel transistor 2 is connected to the output terminal of a two-input NOR gate 4 receiving an inverted signal generated by inverting the enable signal from the enable terminal 6 by an inverter 5 and the signal from the output data terminal 7. The drains of the P-channel transistor 1 and the N-channel transistor 2 are connected to the pad 8.

When both the enable signal from the enable terminal 6 and the signal from the output data terminal 7 are at a high level, the P-channel transistor 1 in the output driver 107a is turned on. In this case, when the high level is taken as "1", the LSI 300 outputs "1" from the output pin OP1, OP2 or OP3 via the corresponding pad 8. When the enable signal from the enable terminal 6 is at a high level and the signal from the output data terminal 7 is at a low level, the N-channel transistor 2 in the output driver 107a is turned on. In this case, the LSI 300 outputs "0" from the output pin OP1, OP2 or OP3 via the corresponding pad 8.

Next, the procedures in the board test by the boundary scan method will be described referring to FIG. 3. On the board to be tested, an LSI (A) 300a and an LSI (B) 300b both in accordance with the standard for the boundary scan method are mounted. Nodes I1, I2 and I3 are input terminals provided at the board edge, and are connected to input pins IP1, IP2 and IP3 of the LSI (A) 300a, respectively. Nodes A, B and C are wirings for connecting output pins OP1, OP2 and OP3 of the LSI (A) 300a to input pins IP1, IP2 and IP3 of the LSI (B) 300b, respectively. Nodes O1, O2 and O3 are output terminals provided at the board edge, and are connected to output pins OP1, OP2 and OP3 of the LSI (B) 300b, respectively. The board further has, at the edge thereof, input terminals TCK and TMS for the test clock and the test mode selecting signal respectively connected to the input pins TCK and TMS for test use only in boundary scan logics 103 in the LSI (A) 300a and the LSI (B) 300b, a test data input terminal TDI connected to the test data input pin TDI of the LSI (A) 300a, and test data output terminal TDO connected to the test data output pin TDO of the LSI (B) 300b. Further, the test data output pin TDO of the LSI (A) 300a is connected to the test data input pin TDI of the LSI (B) 300b.

Now, a result of the test of the connection between the output pins OP1 through OP3 of the LSI (A) 300a and the input pins IP1 through IP3 of the LSI (B) 300b will be described based on Tables 1 through 3. In Tables 1 through and the following description, the high level is taken as "1" and the low level is taken as "0". Tables 1 through 3 show a pattern observed at the input pins IP1 through IP3 of the LSI (B) 300b corresponding with a test pattern output from the LSI (A) 300a through the nodes A, B and C. Table 1 shows the patterns observed when the LSI (A) 300a and the LSI (B) 300b are correctly connected, Table 2 shows those observed when the node A is short-circuited with a power-supply potential VDD, and Table 3 shows those observed when the nodes A and B are short-circuited.

First, the boundary scan logic 103 sets the boundary register cells 104 of the LSI (A) 300a as to output "1" from the output pin OP1, "0" from the output pin OP2 and "0" from the output pin OP3. When the EXTEST instruction is loaded in the instruction register 103a in the boundary scan logic 103 of the LSI (A) 300a, the output pin OP1 outputs "1" to the node A, the output pin OP2 outputs "0" to the node B and the output pin OP3 outputs "0" to the node C. Then, the signals input from the nodes A, B and C to the input pins IP1, IP2 and IP3 of the LSI (B) 300b, respectively, are latched in the corresponding boundary register cells 104 and the the latched signals are output from the test data pin TDO. Then a tester checks the values of the signals. Next, the values at the boundary register cells 104 in the LSI (A) 300a are shifted so as to output "0" from the output pin OP1, "1" from the output pin OP2 and "0" from the output pin OP3. The values of the signals input through the input pins IP1 through IP3 of the LSI (B) 300b are similarly latched in the boundary register cells 104 in the LSI (B) 300b, and the latched signals output from the test data output terminal TDO. Then the tester checks the values of the signals. Finally, the LSI (A) 300a is set to output "1" from the output pin OP1, "0" from the output pin OP2 and "0" from the output pin OP3, and the signals input to the LSI (B) 300b through the input pins IP1 through IP3 are observed.

In this test, when the LSI (A) 300a is correctly connected to the LSI (B) 300b through the nodes A, B and C, the pattern of the signals input to the LSI (B) 300b through the input pins IP1, IP2 and IP3 are the same pattern as that of the signals output from the LSI (A) 300a through the output pins OP1, OP2 and OPS as is listed in Table 1.

When the node A is short-circuited with the power-supply potential (VDD), however, the signals cannot be correctly transferred from the LSI (A) 300a to the LSI (B) 300b as is listed in Table 2. In this case, the signal input to the LSI (B) 300b through the input pin IP1 is always "1", and hence, the short circuit of the node A to the power-supply potential can be detected.

When it is assumed that a current magnitude flowing in a transistor for outputting "1" is larger than that flowing in a transistor for outputting "0", that is, the output drive power of "1" is larger than that of "0" in the LSI (A) 300a, the signal pattern received by the LSI (B) 300b with a short circuit between the nodes A and B as in the case shown in Table 3 is "110", which is the logical OR between the outputs of the nodes A and B. On the contrary, when it is assumed that the output drive power of "0" is larger than that of "1" in the LSI (A) 300a, the signal pattern received by the LSI (B) 300b is "000", which is the logical product between the outputs of the nodes A and B.

In this manner, the input values to the LSI (B) 300b from the LSI (A) 300a are observed by utilizing the boundary scan cells. As a result, when the input signals take fixed values or are wired-OR or wired-AND, it can be determined that there is a defect between the LSIs caused by a short circuit, an open circuit or the like.

In such a conventional LSI, in the case of a complete short where, for example, the node A and a power supply line are soldered by mistake and the node A is completely short-circuited with the VDD, the signal observed at the input pin IP1 of the LSI (B) 300b is always "1" regardless of the value of the signal output from the output pin OP1 of the LSI (A) 300a. Therefore, the short circuit can be detected. But in the case of a slight short where, for example, a component or the like falls and lies on both the node A and the power supply line thereby to slightly short-circuit the node A with the VDD, the short sometimes cannot be detected.

In a case as shown in FIG. 4, where it is assumed that the N-channel transistor 2 in the output driver 107a has a general drive power as an LSI, and has an on resistance of, for example, approximately 30Ω, that the VDD is 3V, and that the input pin IP1 of the LSI (B) 300b has such a general TTL level as to determine an input voltage of 1.5V or more to be the high level. Under this condition, when there is a complete short circuit as mentioned above with a resistance of approximately 30Ω or less in the node A, the output voltage of the output pin OP1 of the LSI (A) 300a does not lower below 1.5V, and hence, the signal input to the input pin IP1 of the LSI (B) 300b is always "1", and is never "0". Therefore, the short circuit can be detected. In this conventional LSI, however, a slight short circuit as mentioned above of the node A with a resistance of several hundreds ohms cannot be detected.

Next, a test for a board mounting an LSI (C) 300c, an LSI (D) 300d, an LSI (E) 300e and an LSI (F) 800f as is shown in FIG. 8 by the boundary scan method will be described in this test, while a signal pattern "111" is being output from the LSI (C) 300c to the LSI (D) 300d, a signal pattern "010" is output from the LSI (E) 300e to the LgI (F) 300f, thereby checking whether a short circuit is caused between a node X which connects the LSI (C) 300c and the LSI (D) 300d, and a node Y which connects the LSI (E) 300e and the LSI (F) 300f. When the nodes X and Y are not short-circuited, the signal pattern "010" is correctly transferred from the LSI (E) 300e to the LSI (F) 30 of through the node Y. When the nodes X and Y are short-circuited, the signal pattern cannot be correctly transferred through the node Y. In this case, though the output drive power of the LSI (C) 300c is equal to that of the LSI (E) 300e, the signal patterns received by the LSI (D) 300d and the LSI (F) 300f are any of "111", "010" and "011" depending upon the variation in the drive powers of the respective LSIs caused by manufacturing variations when the outputs from the LSI (C) 300c and the LSI (E) 300e run against each other due to the short circuit between the nodes X and Y. As described above, the signal pattern resulting from the short circuit cannot be defined, it is difficult to accurately determine whether the node X is short-circuited with the node Y or with any other node. Moreover, since the signal pattern resulting from the short circuit is undefined, there is a possibility that a correct pattern is accidentally transferred in spite of the short circuit. In this case, the defect cannot be detected.

SUMMARY OF THE INVENTION

The present invention was devised to overcome the aforementioned problems. A first object of the invention is to provide a semiconductor device with a high detection accuracy for a defect which can detect a slight short or open circuit by switching an output drive power of an output buffer therein to a smaller drive power than that for the ordinary operation.

A second object of the invention is to provide a semiconductor device which maintains reliability of the device by switching an output drive power to be smaller than that in an ordinary operation when executing a test of the devices whose connection being short-circuited thereby to prevent so much current to flow as to damage the device.

A third object of the invention is to provide a semiconductor device with an output buffer being able to switch an output drive power to be larger than that in an ordinary operation thereby to surely detect a short-circuit between a connection series with the device and another connection series with a device only having a drive power of an ordinary operation.

In carrying out our invention in one preferred mode, we utilize a semiconductor device comprising an output buffer for outputting a signal for the test, which has drive powers of at least two levels, the level being graded by a magnitude of a current flowing in a constituent element therein, means for switching the drive power to be smaller or to be larger when executing the test, and means for enabling the test signal input to the other device to be observed from the outside.

A fourth object of the invention is to provide a test method for a connection of semiconductor devices with a high detection accuracy for a defect in which patterns observed at LSIs in a plurality of connection series to which respectively input signals from other LSIs can be definite when the plurality of connection series are short-circuited.

In carrying out our invention in one preferred mode, we utilize a method for testing a connection of semiconductor devices comprising the steps of disposing, in one connection series, a semiconductor device comprising a buffer which has drive powers of at least two levels, the level being graded by a magnitude of a current flowing in a constituent element therein, whose larger drive power is larger than the drive power of said one semiconductor device in one of the other connection series, switching the drive power of said one semiconductor device in said one connection series to be larger when executing the test, and supplying test signals to said one semiconductor devices in the at least two connection series, respectively, to enable the test signals to be observed from the outside respectively input to said other semiconductor devices.

The above and further objects and features of the invention will more fully be apparent from the following detailed description with accompanying drawings.

DESCRIPTION OF THE PREFERRED EMBODIMENTS

The present invention will now be described based on the accompanying drawings illustrating the examples thereof.

EXAMPLE 1

Figure 1:
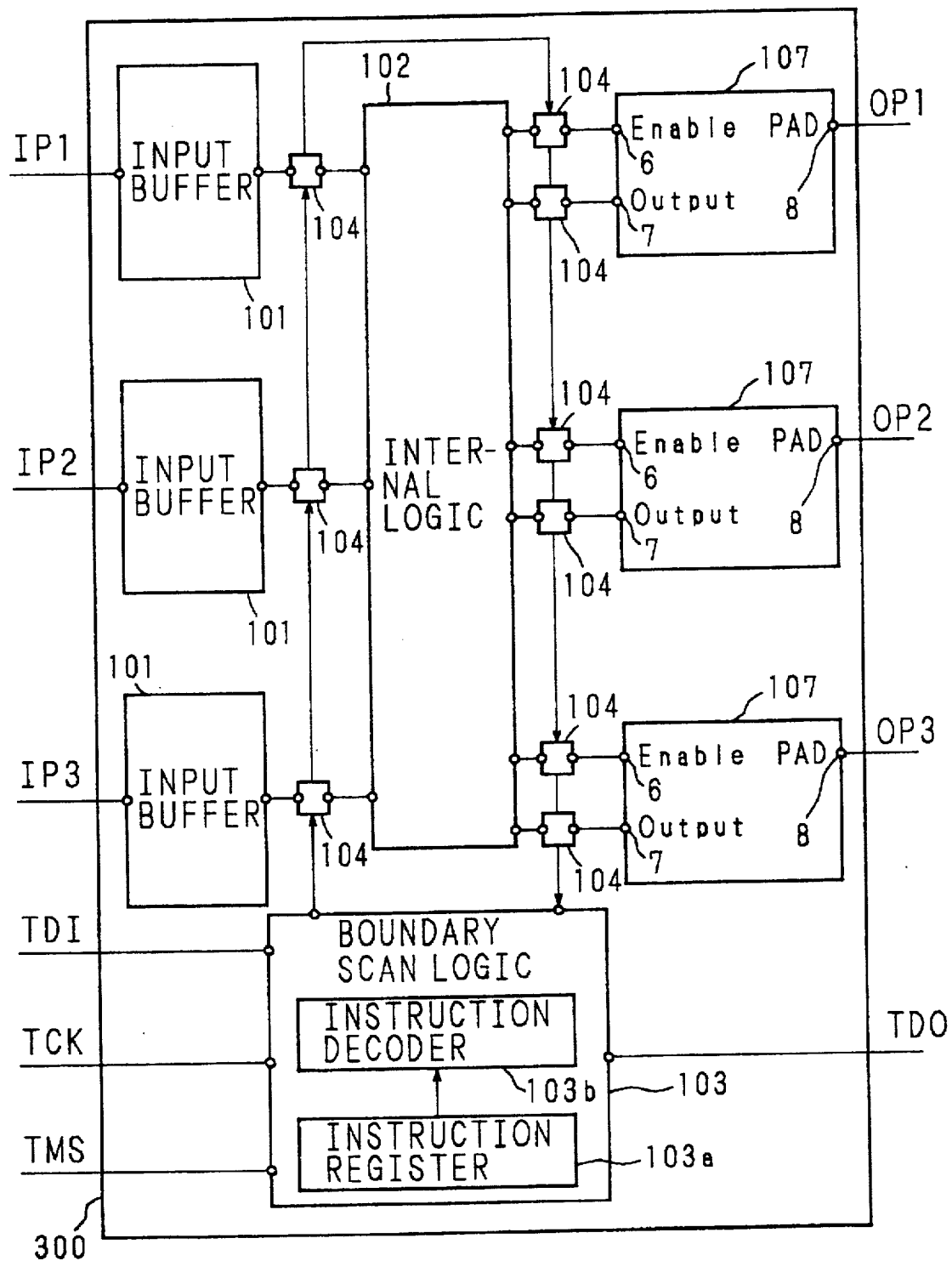
FIG. 1 is a block diagram showing the configuration of a conventional LSI.
Figure 2:
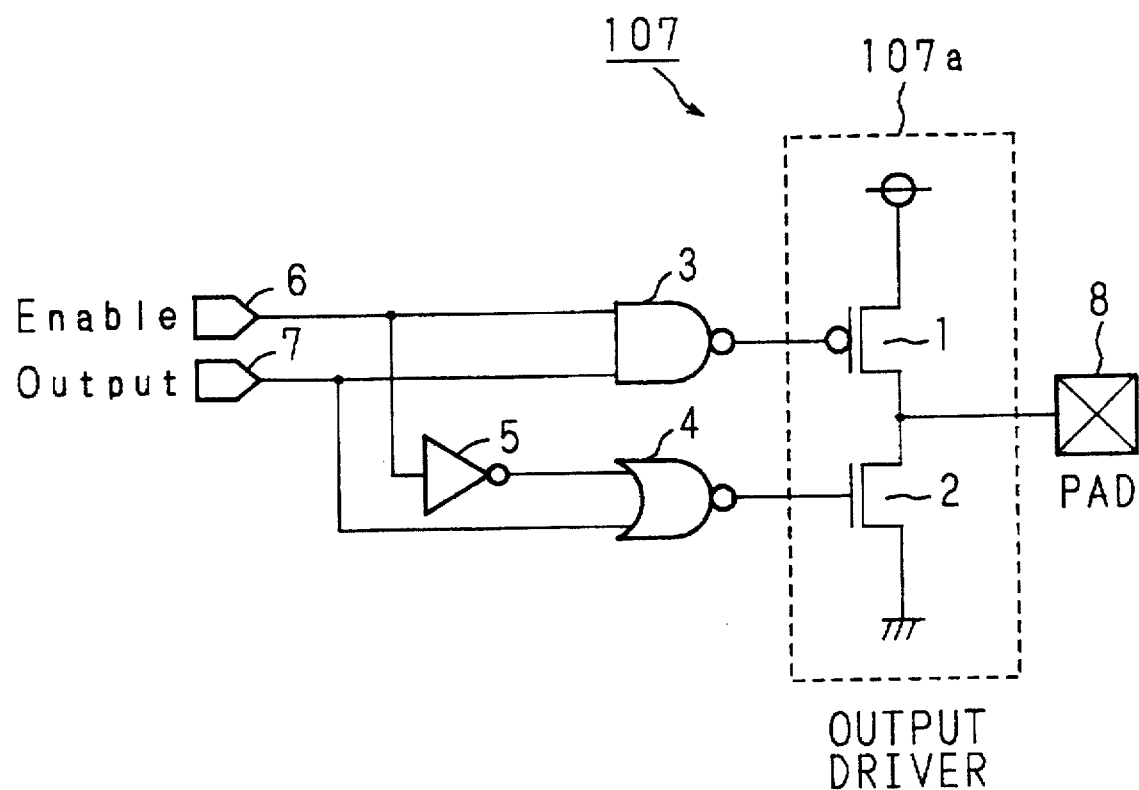
FIG. 2 is a circuit diagram of an output buffer in the conventional LSI.
Figure 3:
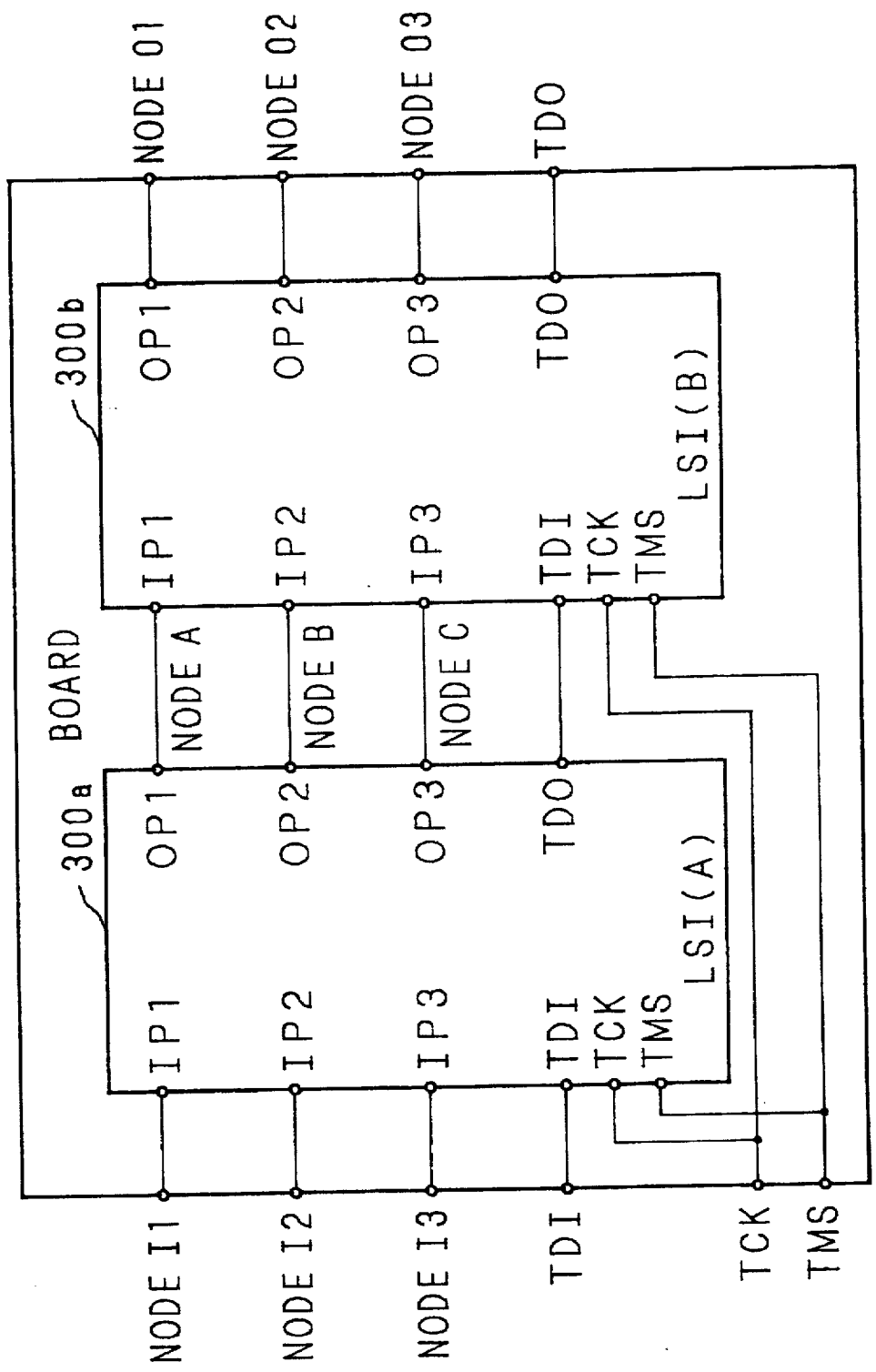
FIG. 3 is a diagram of a board for illustrating a board test by the boundary scan method.
Figure 4:
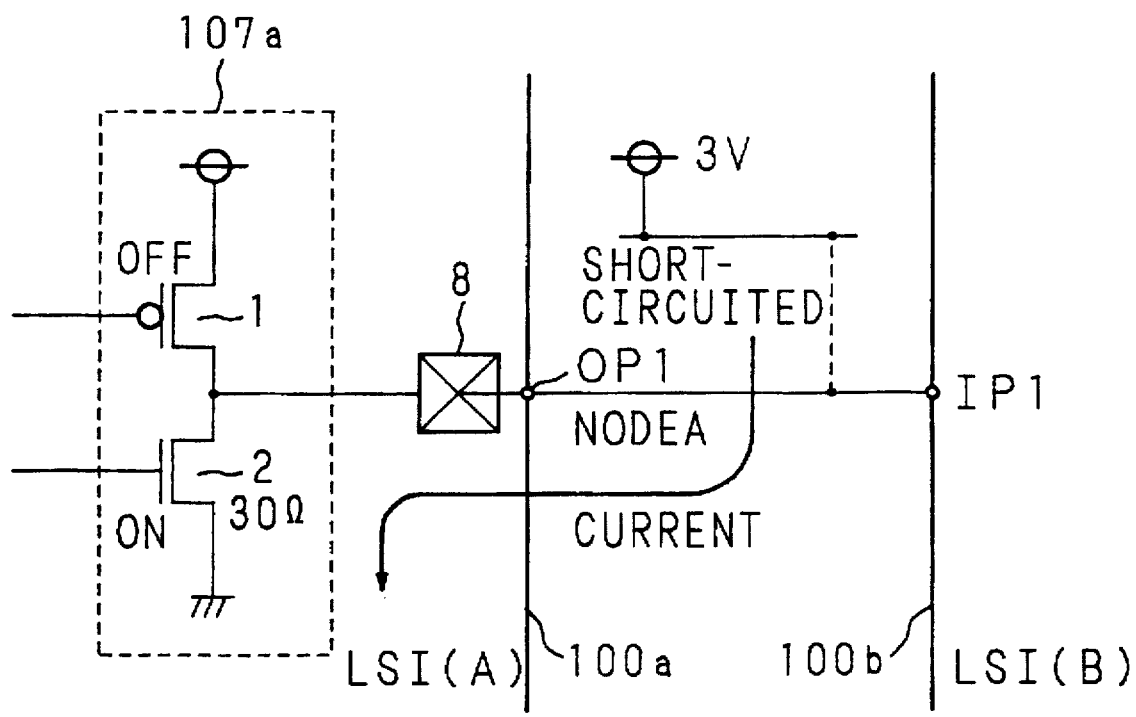
FIG. 4 is a circuit diagram showing the state when a short-circuit occurs in the conventional LSI.
Figure 5:
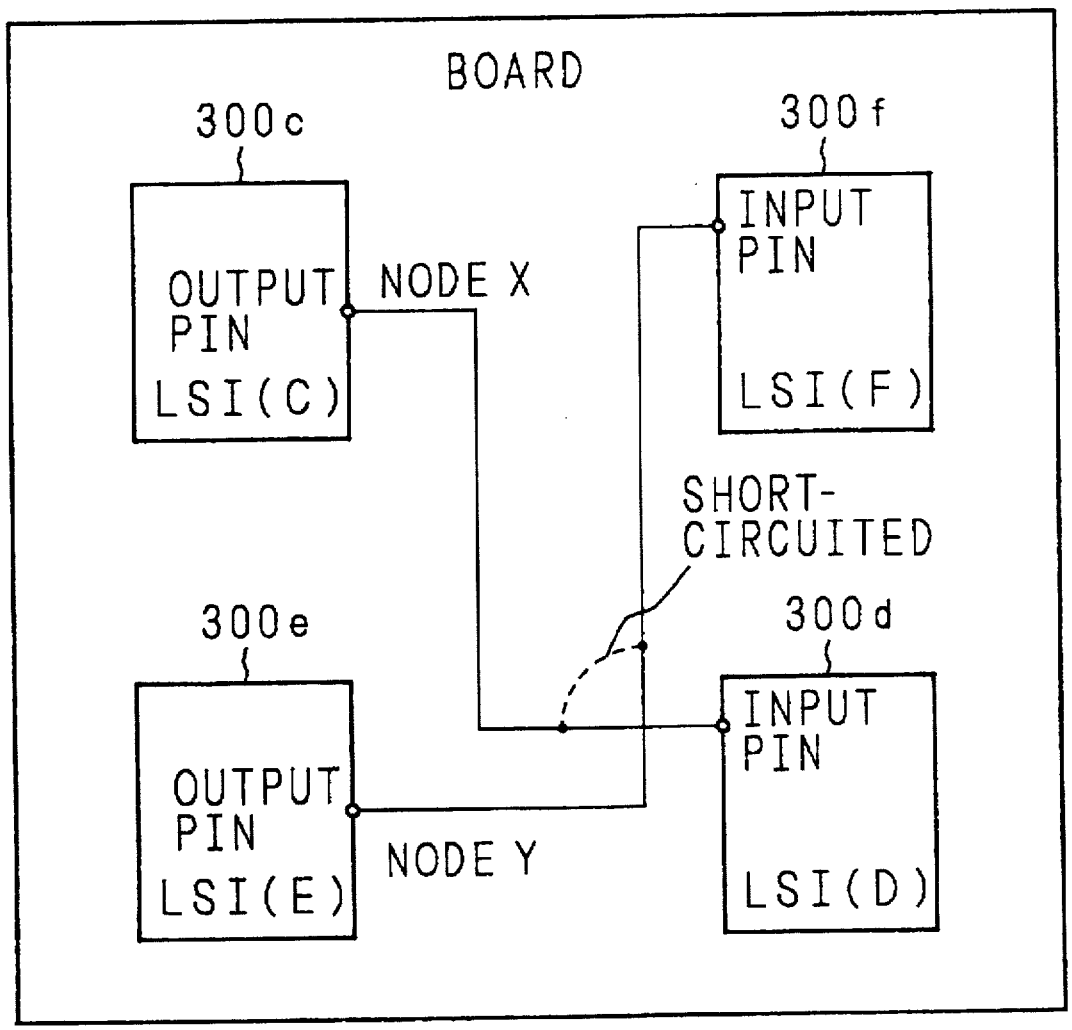
FIG. 5 is a diagram of a board for exemplifying another conventional LSI testing method.
Figure 6:
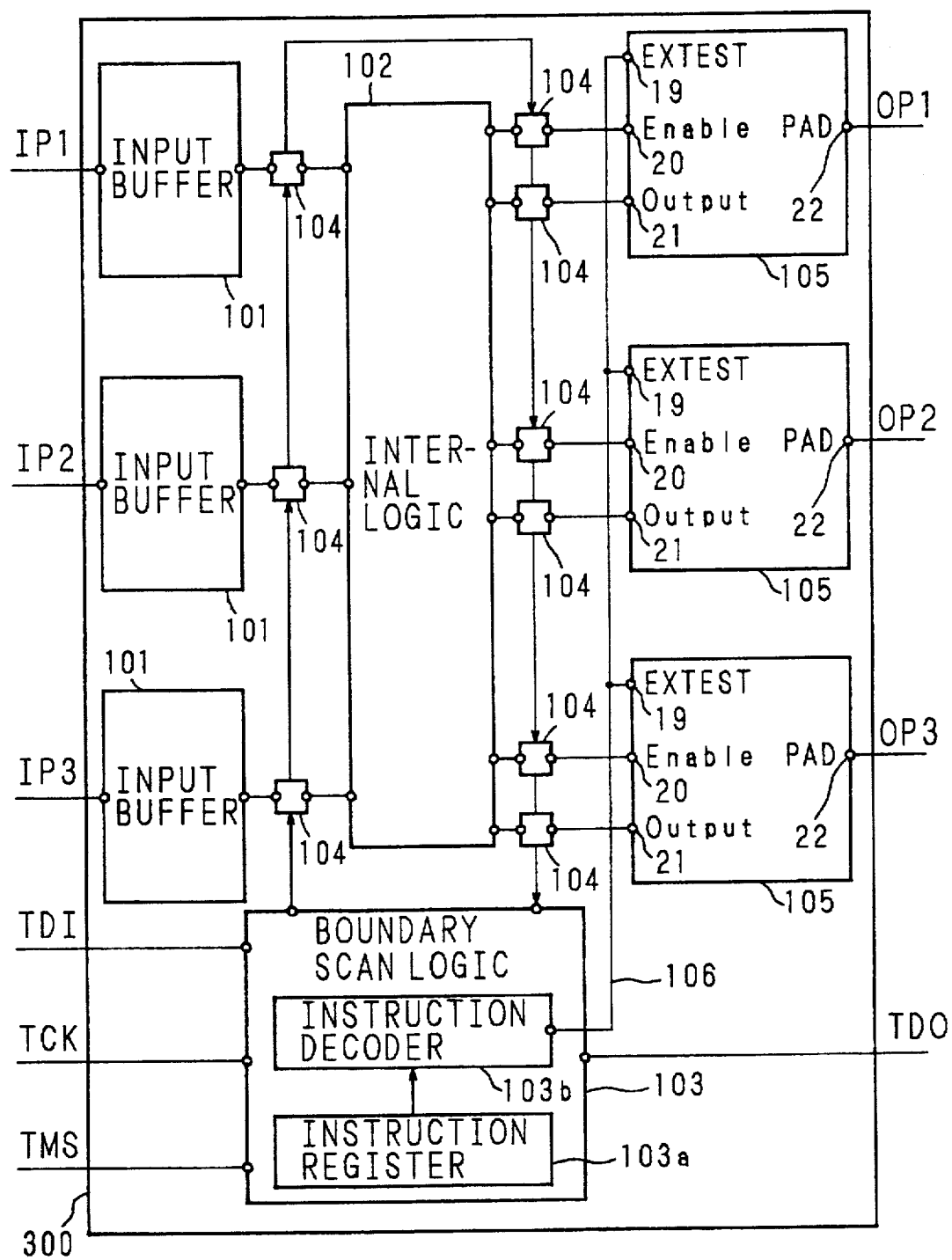
FIG. 6 is a block diagram showing the configuration of an LSI according to the invention.

FIG. 6 is a block diagram of an LSI 100 of the invention manufactured in accordance with the standard for the boundary scan method. The LSI 100 supplies signals received through input pins IP1, IP2 and IP3 to an internal logic 102 via respective input buffers 101. The internal logic 102 performs a logical operation on the received signals. The LSI 100 further includes output buffers 105 and output pins OP1, OP2 and OP3. Each of the output buffers 105 has an enable terminal 20, that is, an input terminal for an enable signal that controls whether or not an output driver (described in detail below) is enabled to output data, and an output data terminal 21, that is, an input terminal for the data output by the output driver of another LSI. When the enable signal becomes significant, the output buffer 105 outputs the data received through the output data terminal 21 from the corresponding output pin OP1, OP2 or OP3 connected to a pad 22 provided for each output buffer 105. The output buffer 105 further has an EXTEST terminal 19, that is, an input terminal for an EXTEST signal (drive power selecting signal) 106. The EXTEST signal is negated in the ordinary operation of the LSI 100, but is asserted when an instruction decoder 103b in a boundary scan logic 105 described below decodes a switching instruction of a drive power of the output buffer 105, the instruction being included in an EXTEST instruction for testing the external of the LSI 100 or in a private instruction (equivalent instruction with the EXTEST instruction including the LSI external test instruction and the drive power switching instruction).

Further, the LSI 800 has, as terminals for test use only, an input pin TMS for a test mode selecting signal that is set in performing the board test, a test data input pin TDI, an input pin TCK for a test clock and a test data output pin TDO. The LSI 100 further has, as circuits for test use, the boundary scan logic 103 and boundary register cells 104. The boundary scan logic 103 includes an instruction register 103a for loading a test instruction such as the EXTEST instruction or the private instruction or the like for testing the external of the LSI, and the instruction decoder 103b for decoding the instruction loaded in the instruction register 103a. The boundary register cells 104 are composed of flip-flops and provided between the respective input buffers 101 and the internal logic 102 and between the internal logic 102 and the respective output buffers 105 so as to correspond to the respective input pins IP1, IP2 and IP3 and the respective enable terminals 20 and output data terminals 21.

The boundary register cells 104 are connected in series to the boundary scan logic 103 so as to form a shift register. In testing a connection between the LSIs and the boundary scan logic 103 setting test data in the boundary register cells 104, the test data set in each boundary register cell 104 is shifted synchronously with the test clock input through the input pin TCK in a direction indicated by an arrow in the drawing. The boundary scan logic 103 outputs the values output by the boundary register cells 104 corresponding to the output data terminals 21 via the output buffers 105 through the output pins OP1 through OP3 to the outside. Or the boundary scan logic 103 makes the boundary register cells 104 to latch data input from another LSI through the input pins IP1 through IP3 and outputs the latched data to the outside of the LSI 300 via the output pin TDO so as to enable to observe the test result from the outside. The instruction decoder 103b asserts the EXTEST signal 106 when decoding the EXTEST instruction or the drive power switching instruction included in the private instruction.

In the ordinary operation of the LSI 100, an input signal is input to the LSI 100 through the input pins IP1, IP2 and IP3, transferred to the input buffers 101 and the boundary register cells 104 disposed between the input buffers 101 and the internal logic 102, and reaches the internal logic 102. An output signal from the internal logic 102 is transferred to the boundary register cells 104 disposed between the internal logic 102 and the output buffers 105 to reach the output buffers 105, and is output from the output pins OP1, OP2 and OP3.

Figure 7:
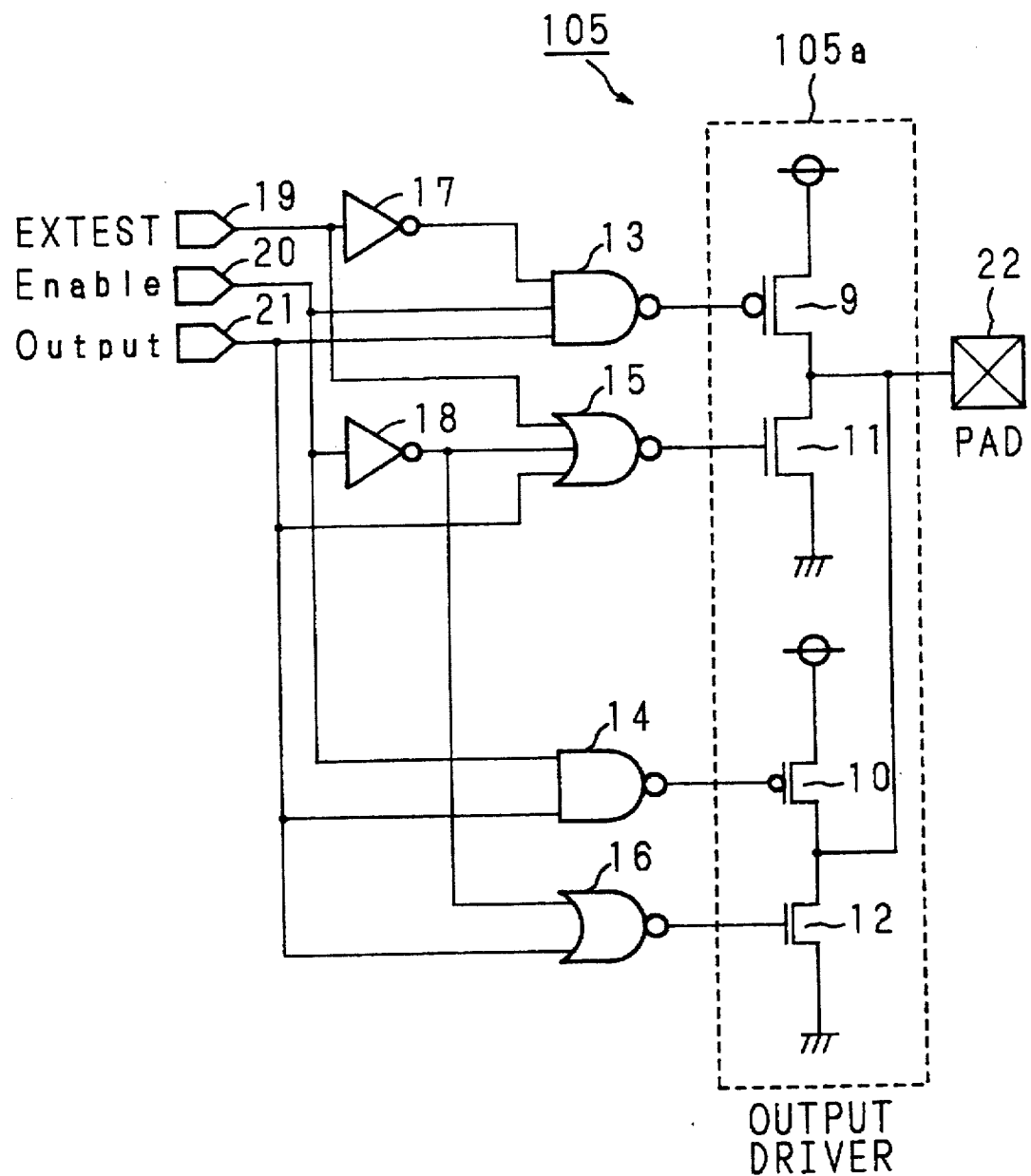
FIG. 7 is a circuit diagram of an output buffer in the LSI shown in FIG. 6.

FIG. 7 is a circuit diagram showing an exemplified configuration of an output buffer 105 of the LSI according to the invention shown in FIG. 6.

The output buffer 105 includes an output driver 105a formed from first CMOS transistors and second CMOS transistors. The first CMOS transistors are composed of a P-channel transistor 9 whose source is connected to a power supply and an N-channel transistor 11 whose source is grounded, and are turned on in the ordinary operation of the LSI 100 but are turned off in performing the board test. The second CMOS transistors are composed of a P-channel transistor 10 whose source is connected to a power supply and an N-channel transistor 12 whose source is grounded. The second CMOS transistors are set to have an output drive power of 1% of that of the output driver 105a in the ordinary operation, and are turned on both in the ordinary operation and in the board test.

The gate of the P-channel transistor 9 in the first CMOS transistors is connected to an output terminal of a three-input NAND gate 13 which receives a signal generated by inverting, by an inverter 17, the EXTEST signal input to the EXTEST terminal 19 to control the output drive power of the output driver 105a by turning on or off the transistors 9 and 11, the enable signal to the enable terminal 20, and a signal to the output data terminal 21. The gate of the N-channel transistor 11 is connected to an output terminal of a three-input NOR gate 15, which receives a signal generated by inverting the enable signal to the enable terminal 20 by an inverter 18, the signal to the output data terminal 21 and the EXTEST signal to the EXTEST terminal . The drains of the P-channel transistor and the N-channel transistor 11 are connected to the pad 22.

The gate of the P-channel transistor 10 in the second CMOS transistors is connected to an output terminal of a two-input NAND gate 14 receiving the enable signal to the enable terminal 20 and the signal to the output data terminal 21. The-gate of the N-channel transistor 12 is connected to an output terminal of a two-input NOR gate 18 receiving a signal generated by inverting the enable signal to the enable terminal 20 by the inverter 18 and the signal to the output data terminal 21. The drains of the P-channel transistor 10 and the N-channel transistor 12 are connected to the pad 22.

In the ordinary operation of the LSI 100, the EXTEST signal is negated to be at a low level, and hence, both the first CMOS transistors (i.e., the P-channel transistor 9 and the N-channel transistor 11) and the second CMOS transistors (i.e., the P-channel transistor 10 and the N-channel transistor 12) operate. Under this condition, when the enable signal input through the enable terminal 20 is at a high level and the signal from the output data terminal 21 is at a high level, the P-channel transistors 9 and 10 in the output driver 105a are turned on, and therefore, in assuming that the high level is "1", "1" is output from the output pin OP1, OP2 or OP3 via the corresponding pad 22. When the enable signal input through the enable terminal 20 is at a high level and a signal from the output data terminal 21 is at a low level, the N-channel transistors 11 and 12 in the output driver 105a are turned on, and therefore, "0" is output from the output pin OP1, OP2 or OP3 via the corresponding pad 22.

In the board test, the EXTEST signal is asserted to be at a high level. Therefore, the first CMOS transistors 9 and 11 are turned off, and the second CMOS transistors 10 and 12 alone operate. As a result, the output drive power of the output driver 105a lowers as compared with that for the ordinary operation.

Figure 8:
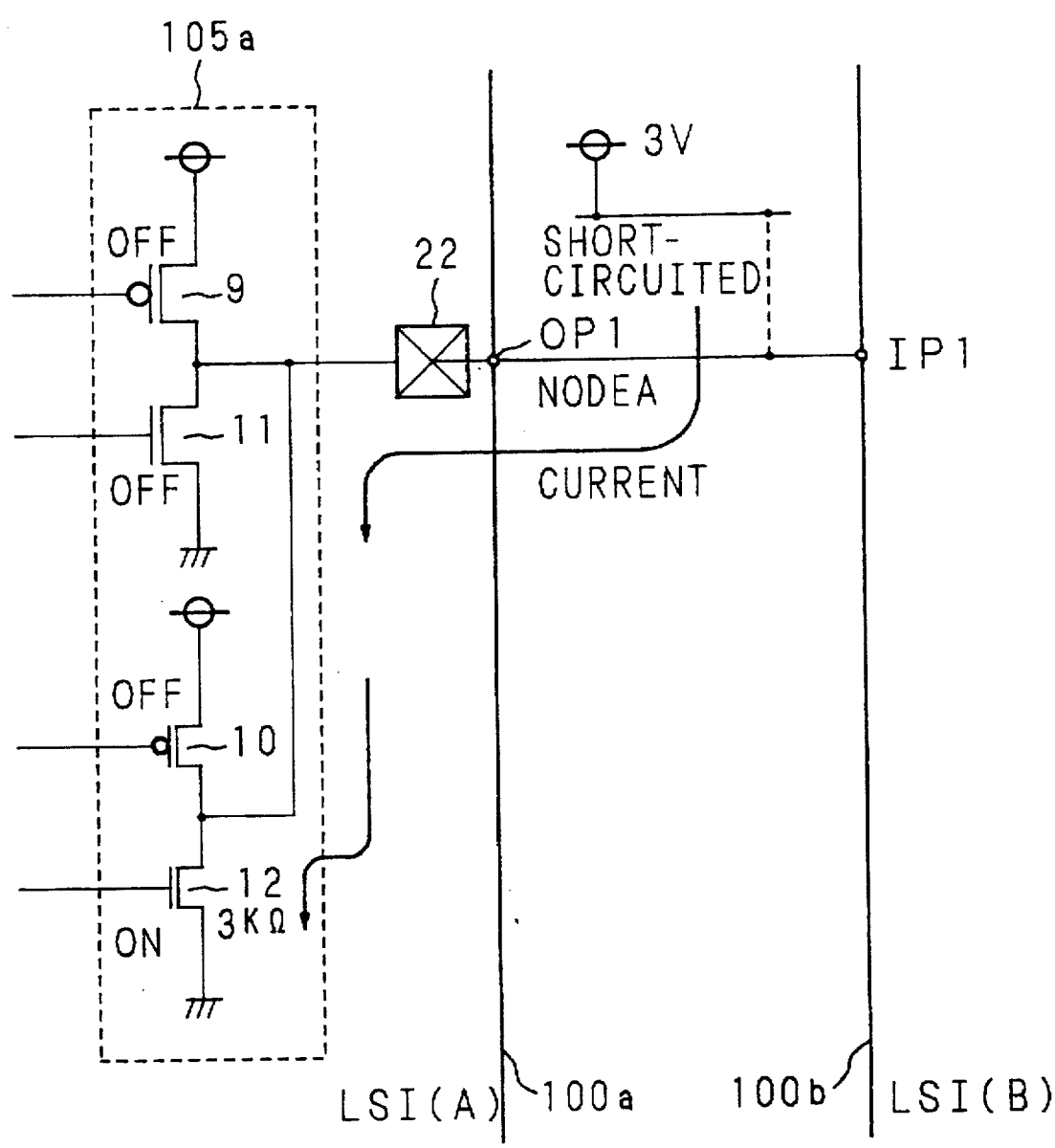
FIG. 8 is a circuit diagram showing the state when a short-circuit occurs in the LSI of the invention.

The reason why the detection accuracy for defects or failures improves will be described with referring to FIG. 8 when applying the LSI of the invention being able to lower the output drive power from that in the ordinary operation comparing with the conventional LSI performing the board test with the same output drive power as the ordinary operation. FIG. 8 is an enlarged view of an output driver 105a in an LSI (A) 100a and a node A connecting an output pin OP1 of the LSI (A) 100a and an input pin IP1 of an LSI (B) 100b.

When the EXTEST instruction or the private instruction is loaded in the instruction register 103a in the boundary scan logic 103 in performing the board test, the EXTEST signal 106 output from the instruction decoder 103b is asserted responsive to decoding of the instruction by the instruction decoder 103b. When the EXTEST signal 106 is asserted to be at a high level ("1"), the first CMOS transistors 9 and 11, which Operate in the ordinary operation alone, are turned off, and merely the second CMOS transistors 10 and 12, which operate in the board test as well, output data.

In FIG. 8, the N-channel transistor 12 alone is turned on for outputting a signal at a low level as the output data. of the output driver 105a, and the other transistors 9, 10 and 11 are all turned off. The N-channel transistor 12, which is set to have the drive power of 1% of that of the output driver 105a for the ordinary operation, is assumed to have an on resistance of approximately 3kΩ. It is also assumed that the VDD is 3V, and that the input pin IP1 of the LSI (B) 100b has such a general TTL level as to determine the input voltage of 1.5V or more to be the high level.

When the node A is completely short-circuited with the VDD, the input pin IP1 of the LSI (B) 100b always receives "1" regardless of the value of the signal transferred from the output pin OP1 of the LSI (A) 100a. Accordingly, the short circuit can be detected with ease as in the conventional LSI When the node A is slightly short-circuited with the VDD so as to have a resistance of 3kΩ or less, the output voltage cannot lower below 1.5V since the on resistance of the N-channel transistor 12 is approximately 3kΩ. Therefore, in this case, a signal at a low level cannot be transferred, which enables to detect the short circuit. In this manner, the extent of a detectable short circuit is expanded to a resistance of 3kΩ in the present invention, while it is merely up to a resistance of 30Ω in the conventional LSI. Therefore, in the present LSI, a slight short circuit with a resistance of several hundreds ohms, which cannot be detected in the conventional LSI, can be detected. Thus, the detection accuracy improves.

Furthermore, the present LSI not only improves the detection accuracy in the board test but also suppresses a possible damage caused by the board test. In the conventional LSI, when a board including a short circuit is tested, the LSIs thereon can be damaged during the test because a current with the same magnitude as that in the ordinary operation flows through a route via a short-circuited part other than the inherent routes in the LSIs. In the present LSI, however, merely a small current flows in such a case because the drive power is small. Therefore, such a large current as to damage the LSIs would not flow even when the tested board includes a short circuit. Thus, the reliability of the LSIs can be maintained.

EXAMPLE 2

Figure 9:
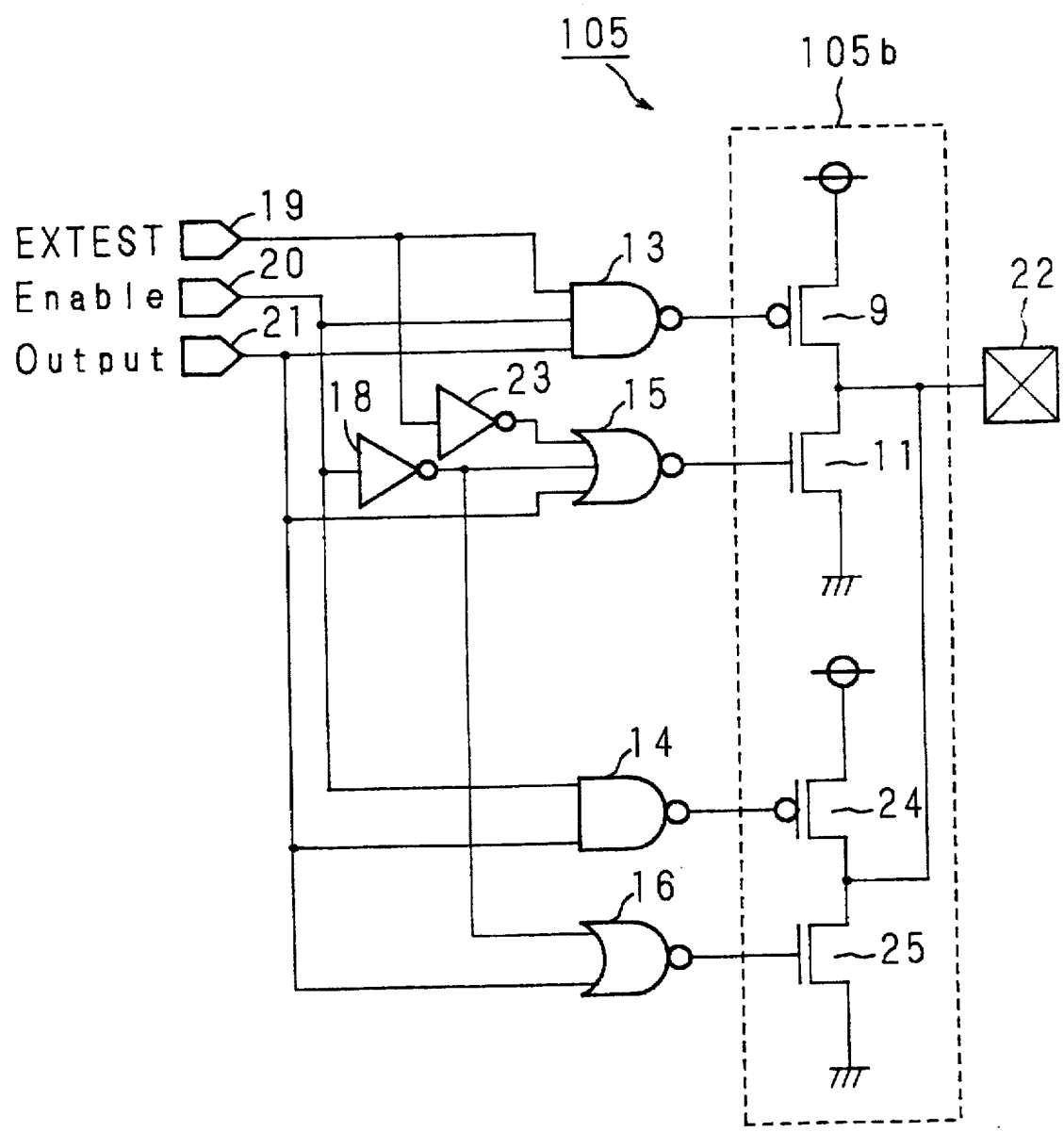
FIG. 9 is a circuit diagram of another output buffer in the LSI shown in FIG. 6.

FIG. 9 is an enlarged circuit diagram of an output buffer according to another example of the present LSI. The like reference numerals are used to refer to like elements used in Example 1, and the description is omitted here. The LSI according to Example 2 has the same configuration as that of Example 1 except that the drive power of an output driver 105b is larger in the board test than in the ordinary operation in the output buffer of Example 2.

As is shown in FIG. 9, the output buffer 105 has an output driver 105b formed from first CMOS transistors and second CMOS transistors. The first CMOS transistors are composed of the P-channel transistor 9 whose source is connected to the power supply and the N-channel transistor 11 whose source is grounded, and are turned off in the ordinary operation of the LSI but are turned on in performing the board test. The second CMOS transistors are composed of a P-channel transistor 24 whose source is connected to a power supply and an N-channel transistor 25 whose source is grounded. The second CMOS transistors are set to have the same drive power as that of the first CMOS transistors, and operate both in the ordinary operation and the board test.

The gate of the P-channel transistor 9 in the first CMOS transistors is connected to the output terminal of the three-input NAND gate 13 which receives the EXTEST signal input to the EXTEST terminal 19 to control the output drive power of the output driver 105a by turning on or off the transistors 9 and 11, the enable signal to the enable terminal 20, and the signal to the output data terminal 21. The gate of the N-channel transistor 11 is connected to the output terminal of the three-input NOR gate 15 which receives a signal generated by inverting the EXTEST signal to the EXTEST terminal 19 by an inverter 23, a signal generated by inverting the enable signal to the enable terminal 20 by the inverter 18, and the signal to the output data terminal 21. The drains of the P-channel transistor 9 and the N-channel transistor 11 are connected to the pad 22.

Figure 10:
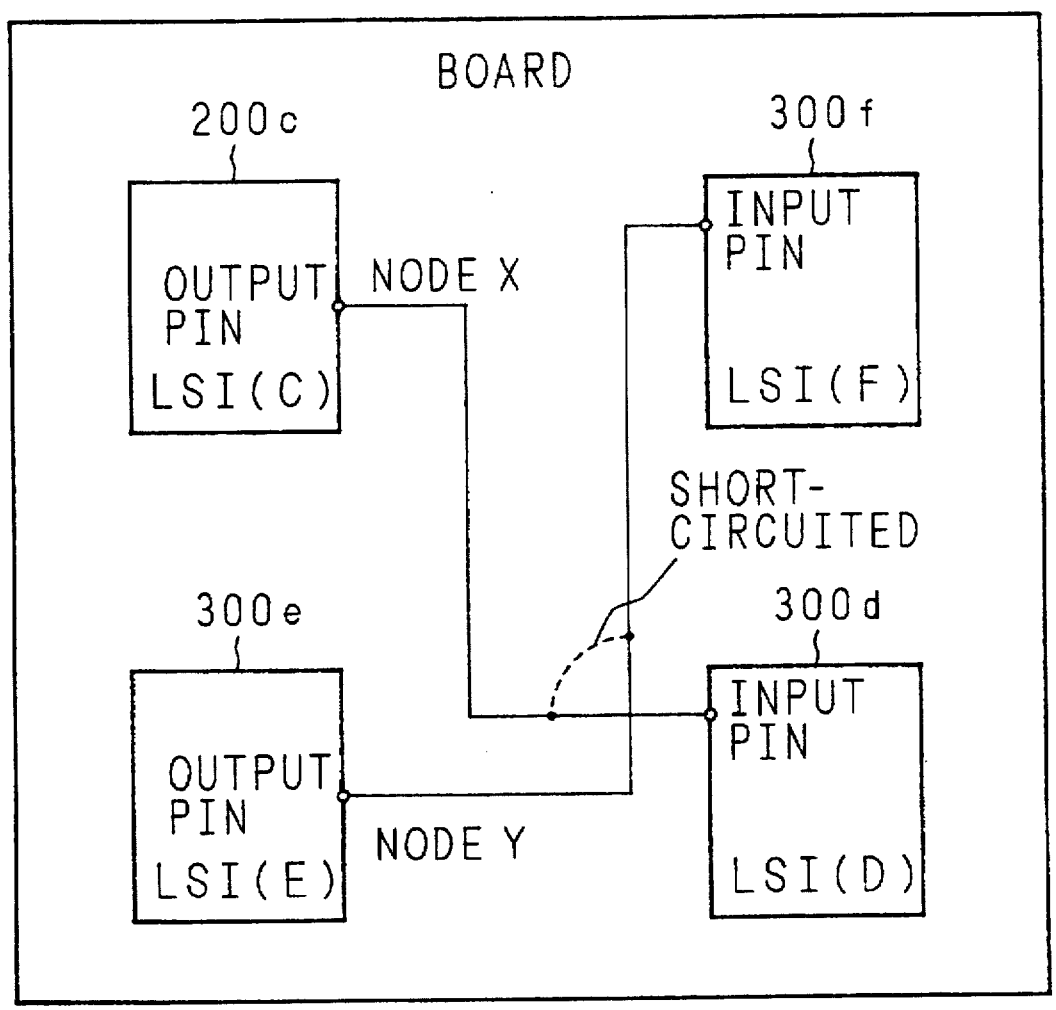
FIG. 10 is a diagram of a board for exemplifying an LSI test method according to the invention.

The gate of the P-channel transistor 24 in the second CMOS transistors is connected to the output terminal of the two-input NAND gate 14 which receives the enable signal to the enable terminal 20 and the signal to the output data terminal 21. The gate of the N-channel transistor 25 is connected to the output of the two-input NOR gate 16 which receives a signal generated by inverting the enable signal to the enable terminal 20 by the inverter 18 and the signal to the output data terminal 21. The drains of the P-channel transistor 24 and the N-channel transistor 25 are connected to the pad Next, the board test for detecting a short circuit between two connection series by using the present LSI having the larger drive power for the board test than that for the ordinary operation will be described referring to FIG. 10 and Tables 4 and 5. On the board to be tested is mounted an LSI (C) 200c and an LSI (D) 300d connected with a node X, and an LSI (E) 300e and an LSI (F) 300f connected with a node Y as is shown in FIG. 10, and the nodes X and Y are tested whether a short circuit occurs therebetween. Among these four LSIs, the LSI (C) 200c, which is one of the LSIs disposed in the upper stream of the current flow, is the LSI of this example having the larger drive power for the board test than that for the ordinary operation, and the LSI (D) 300d, the LSI (E) 300e and the LSI (F) 300f have a drive power of one level, namely have the same drive power both in the ordinary operation and in the board test.

In the board test by the boundary scan method, first, while the LSI (C) 200c is outputting "1" to the node X with the larger output drive power than in the ordinary operation, a signal is sent from the LSI (E) 300e to the LSI (F) 300f through the node Y. When there is no short circuit between the nodes X and Y, the signal is correctly transferred from the LSI (E) 300e to the LSI (F) 300f as is listed in Table 4. When there is a short circuit between the nodes X and Y, the signal cannot be correctly transferred from the LSI (E) 300e to the LSI (F) 300f through the node Y, but the signal pattern received by the LSI (F) 300f is the logical OR between the nodes X and Y as is listed in Table 5. Since the output drive power of the LSI (C) 200c for the board test is larger than that for the ordinary operation, the signal pattern transferred to the LSI (F) 300f is always the logical OR between the nodes X and Y as in Table 5 even when the output of the LSI (C) 200c having the same drive power as that for the ordinary operation runs against the output of the LSI (E) 300e. Accordingly, it can be easily detected that the node Y which is connected to the LSI (F) 300f having received different signal pattern from that output by the LSI (E) 300e being disposed in the upper stream of the current flow, is short-circuited with the node X.

In this manner, when the output drive power of one of the LSIs disposed in the upper stream of the current flow in two connection series is switched to be larger in the board test than in the ordinary operation, the detection accuracy for a short circuit can improve even when the other LSIs mounted together on the board to be tested are the conventional ones having the same drive power for the board test as that for the ordinary operation.

In such a board test using, as one of the LSIs disposed in the upper stream of the current flow, an LSI having the larger output drive power for the board test than that for the ordinary operation together with the other LSIs having the same output drive power as that for the ordinary operation, the following combinations of the LSIs are applicable in addition to the aforementioned combination, i.e., one of the LSIs disposed in the upper stream being the LSI having the larger output drive power to be used in the board test.

First, an LSI having only one level of drive power is used as the LSI disposed in the upper stream in one connection series, and the LSI disposed in the upper stream in another connection series is an LSI having a smaller drive power other than a drive power for the ordinary operation and the drive power thereof being switched to be smaller in the test. Secondly, both the LSIs disposed in the upper stream in the two connection series have a larger drive power other than a drive power for the ordinary operation, and, in the test, the drive power of the LSI disposed in the upper stream in one connection series is switched to be larger but that of the LSI disposed in the upper stream in the other connection series is switched to be the power for the ordinary operation. Thirdly, the LSI disposed in the upper stream in one connection series has a larger drive power other than the drive power for the ordinary operation, and the LSI disposed in the upper stream in the other connection series has a smaller drive power other than the drive power for the ordinary operation, and, in the test, the drive power of the former LSI is switched to be larger but that of the latter LSI is switched to be smaller.

By any of these combinations, the detection accuracy for a short circuit improves even when the conventional LSI having the ordinary drive power alone is mounted together on the board to be tested, by switching the drive power of the LSI(s) so that the output drive power of the LSI disposed in the upper stream in one connection series is larger than that of the LSI disposed in the upper stream in the other connection series.

Furthermore, although the LSI having either the larger or smaller drive power in addition to the drive power for the ordinary operation is described in Examples 1 and 2, the LSI can have both the larger and the smaller drive powers in addition to the drive power for the ordinary operation.

Further, although an output buffer is exemplified in the aforementioned examples, the output buffer can be replaced with an input/output buffer to attain the same effect in the same circuit configuration.

Moreover, although the larger drive power and the smaller drive power than that for the ordinary operation have merely one level in the examples, these drive powers can have two or more levels.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

TABLE 1

LSI's ARE CORRECTLY CONNECTED

| | LSI (A) OUTPUTTED PATTERN FROM OUTPUT PIN | | | LSI (B) INPUTTED PATTERN TO INPUT PIN | | |
|---|---|---|---|---|---|---|
| NODE A | 1 | 0 | 0 | 1 | 0 | 0 |
| NODE B | 0 | 1 | 0 | 0 | 1 | 0 |
| NODE C | 0 | 0 | 1 | 0 | 0 | 1 |

TABLE 2

NODE A IS SHORT-CIRCUITED TO VDD

| | LSI (A) OUTPUTTED PATTERN FROM OUTPUT PIN | | | LSI (B) INPUTTED PATTERN TO INPUT PIN | | |
|---|---|---|---|---|---|---|
| NODE A | 1 | 0 | 0 | 1 | 1 | 1 |
| NODE B | 0 | 1 | 0 | 0 | 1 | 0 |
| NODE C | 0 | 0 | 1 | 0 | 0 | 1 |

TABLE 3

NODES A AND B ARE SHORT-CIRCUITED

| | LSI (A) OUTPUTTED PATTERN FROM OUTPUT PIN | | | LSI (B) INPUTTED PATTERN TO INPUT PIN | | |
|---|---|---|---|---|---|---|
| NODE A | 1 | 0 | 0 | 1 | 1 | 0 |
| NODE B | 0 | 1 | 0 | 1 | 1 | 0 |
| NODE C | 0 | 0 | 1 | 0 | 0 | 1 |

TABLE 4

NODES X AND Y ARE NOT SHORT-CIRCUITED

| | LSI (C) OUTPUTTED PATTERN FROM OUTPUT PIN | | | LSI (D) INPUTTED PATTERN TO INPUT PIN | | |
|---|---|---|---|---|---|---|
| NODE X | 1 | 1 | 1 | 1 | 1 | 1 |

| | LSI (E) OUTPUTTED PATTERN FROM OUTPUT PIN | | | LSI (F) INPUTTED PATTERN TO INPUT PIN | | |
|---|---|---|---|---|---|---|
| NODE Y | 0 | 1 | 0 | 0 | 1 | 0 |

TABLE 5

NODES X AND Y ARE SHORT-CIRCUITED

| | LSI (C) OUTPUTTED PATTERN FROM OUTPUT PIN | | | LSI (D) INPUTTED PATTERN TO INPUT PIN | | |
|---|---|---|---|---|---|---|
| NODE X | 1 | 1 | 1 | 1 | 1 | 1 |

| | LSI (E) OUTPUTTED PATTERN FROM OUTPUT PIN | | | LSI (F) INPUTTED PATTERN TO INPUT PIN | | |
|---|---|---|---|---|---|---|
| NODE Y | 0 | 1 | 0 | 1 | 1 | 1 |

What is claimed is:

1. A semiconductor device capable of testing for correct electrical connection with another device via a signal output terminal of said semiconductor device, comprising:

an output buffer providing an output signal, said output signal being output from said signal output terminal to the other device during said testing, said output buffer having at least two different driving power levels for driving said output signal, a first driving power level and a second driving power level, less than said first driving power level, said first and second driving power levels being a function of current flowing in constituent elements of said output buffer; and means, responsive to a test signal, for changing said output buffer to provide said output signal at said first driving power level during normal operation and at said second driving power level during said testing for correct electrical connection.

2. The semiconductor device according to claim 1, wherein said output buffer includes a first transistor of a first conductivity type and a second transistor of a second conductivity type connected in series between a first power supply and a second power supply, an output node connected between said first and second transistors, and a third transistor of the first conductivity type and a fourth transistor of the second conductivity type connected in series between said first power supply and said second power supply, said output node connected also between said third and fourth transistors, and said means for changing said output buffer includes a first terminal receiving said test signal, a second terminal for receiving a signal to be output by said output buffer, and a third terminal for receiving a signal for enabling said output buffer, and a first logic circuit, a second logic circuit, a third logic circuit and a fourth logic circuit, said first, second and third terminals being connected to each of said first, second, third and fourth logic circuits, an output of said first logic circuit being connected to a gate of said first transistor, an output of said second logic circuit being connected to a gate of said second transistor, an output of said third logic circuit being connected to a gate of said third transistor, and an output of said fourth logic circuit being connected to a gate of said fourth transistor.

3. The semiconductor device according to claim 1, wherein a logical level of said output signal has the same voltage in case of both said first and second drive power levels of said output buffer.

4. The semiconductor device according to claim 3, wherein said means for receiving a signal to control said output buffer to provide said output signal having the same logical level as the receiving signal in both cases said output buffer is at said first and at second driving power levels.

5. The semiconductor device according to claim 1, further comprising:

an additional signal output terminal; and means for receiving an output signal from outside of said semiconductor device to enable the receiving output signal to be observed at said additional signal output terminal.

* * * * *